(12) United States Patent
Kanemaru et al.

(10) Patent No.: US 11,978,811 B2
(45) Date of Patent: May 7, 2024

(54) SOLAR CELL AND ELECTRONIC DEVICE HAVING THE SAME

(71) Applicant: TDK Corporation, Tokyo (JP)

(72) Inventors: Yoshikazu Kanemaru, Tokyo (JP);
Kouhei Nakanishi, Tokyo (JP)

(73) Assignee: TDK Corporation, Tokyo (JP)

( * ) Notice: Subject to any disclaimer, the term of this patent is extended or adjusted under 35 U.S.C. 154(b) by 69 days.

(21) Appl. No.: 17/917,401

(22) PCT Filed: Mar. 23, 2021

(86) PCT No.: PCT/JP2021/011865
§ 371 (c)(1),
(2) Date: Oct. 6, 2022

(87) PCT Pub. No.: WO2021/205860
PCT Pub. Date: Oct. 14, 2021

(65) Prior Publication Data
US 2023/0163224 A1     May 25, 2023

(30) Foreign Application Priority Data
Apr. 8, 2020   (JP) ................................ 2020-069931

(51) Int. Cl.
*H01L 31/0216*     (2014.01)
*G04C 10/02*       (2006.01)
*H01L 31/0236*     (2006.01)

(52) U.S. Cl.
CPC ........ *H01L 31/02167* (2013.01); *G04C 10/02* (2013.01); *H01L 31/0236* (2013.01)

(58) Field of Classification Search
CPC .......... H01L 31/02167; H01L 31/0236; H01L 31/048; G04C 10/02; Y02E 10/50; G04B 19/06
See application file for complete search history.

(56) References Cited

U.S. PATENT DOCUMENTS

2009/0145478 A1* 6/2009 Takahashi .............. C08J 7/0423
136/256

FOREIGN PATENT DOCUMENTS

JP        2011-013026 A      1/2011

OTHER PUBLICATIONS

International Search Report issued in corresponding International Patent Application No. PCT/JP2021/011865, dated Jun. 1, 2021, with English translation.

* cited by examiner

*Primary Examiner* — Angelo Trivisonno
(74) *Attorney, Agent, or Firm* — Rimon P.C.

(57) ABSTRACT

A solar cell covered with a transparent plate through a predetermined gap includes a flexible power generating layer which photoelectrically converts light incident thereon through the transparent plate, a resin layer covering a light receiving surface of the power generating layer, and an adhesion preventing layer covering the surface of the resin layer and facing the transparent plate through the gap. The adhesion preventing layer is made of an inorganic material and has a surface roughness Sz of 1 nm or more and 500 nm or less. Thus, the outermost surface of the solar cell is constituted by the adhesion preventing layer, so that no tack mark occurs even when partial contact occurs between the solar cell and the transparent plate which face each other through the gap. As a result, it is possible to prevent deterioration in appearance due to the tack mark.

8 Claims, 2 Drawing Sheets

SOLAR CELL AND ELECTRONIC DEVICE HAVING THE SAME

CROSS REFERENCE TO RELATED APPLICATIONS

This application is the U.S. National Phase under 35 U.S.C. § 371 of International Application No. PCT/JP2021/011865, filed on Mar. 23, 2021, which claims the benefit of Japanese Patent Application No. 2020-069931, filed on Apr. 8, 2020, the entire contents of each are hereby incorporated by reference.

TECHNICAL FIELD

The present invention relates to a solar cell and an electronic device having the same and, more particularly, to a solar cell covered with a transparent plate through a predetermined gap and an electronic device having such a solar cell.

BACKGROUND ART

Solar-powered timepieces incorporating a solar cell have recently become widespread. The solar-powered timepiece is advantageous in that battery exchange and spring winding are not necessary. For example, a solar-powered watch disclosed in Patent Document 1 has a solar cell disposed below the dial thereof.

CITATION LIST

Patent Document

[Patent Document 1] JP 2011-013026A

SUMMARY OF THE INVENTION

Problem to be Solved by the Invention

When a solar cell to be used is thin and flexible, the solar cell may warp, so that even when a predetermined gap is provided between the solar cell and dial, they may partly contact each other. In this case, the solar cell and the dial adhere to each other at the contact portion to cause a ring-shaped appearance fault called a "tack mark". Such a problem can occur not only in solar-powered watches but also in general solar cells covered with a transparent plate through a predetermined gap.

An object of the present invention is therefore to prevent, in a solar cell covered with a transparent plate through a predetermined gap and an electronic device having the same, the occurrence of the tack mark due to partial contact between the solar cell and the transparent plate.

Means for Solving the Problem

A solar cell according to the present invention is a solar cell covered with a transparent plate through a predetermined gap and includes a flexible power generating layer which photoelectrically converts light incident thereon through the transparent plate, a resin layer covering a light receiving surface of the power generating layer, and an adhesion preventing layer covering the surface of the resin layer and facing the transparent plate through a gap. The adhesion preventing layer is made of an inorganic material and has a surface roughness Sz of 1 nm or more and 500 nm or less.

According to the present invention, the outermost surface of the solar cell is constituted by the adhesion preventing layer, so that no tack mark occurs even when partial contact occurs between the solar cell and the transparent plate which face each other through a predetermined gap. As a result, it is possible to prevent deterioration in appearance due to the tack mark.

In the present invention, the adhesion preventing layer may have a surface hardness of 2H or more and a thickness of 10 nm or more and 1000 nm or less. This makes it possible to effectively prevent adhesion to the transparent plate.

In the present invention, the adhesion preventing layer may have a light transmittance of 70% or more. This makes it possible to suppress a reduction in the amount of power generation.

An electronic device according to the present invention is an electronic device including a solar cell and a transparent plate covering a solar cell through a predetermined gap. The solar cell includes a flexible power generating layer which photoelectrically converts light incident thereon through a transparent plate and a resin layer covering a light receiving surface of the power generating layer. At least one of the surface of the resin layer facing the transparent plate through the gap and the surface of the transparent plate facing the resin layer through the gap is covered with an adhesion preventing layer made of an inorganic material and having a surface roughness Sz of 1 nm or more and 500 nm or less.

According to the present invention, the outermost surface of the solar cell is constituted by the adhesion preventing layer, so that no tack mark occurs even when partial contact occurs between the solar cell and transparent plate which face each other through a predetermined gap. As a result, it is possible to prevent deterioration in appearance due to the tack mark.

In the present invention, the gap may be 1 mm or less. In this case, partial contact between the solar cell and the transparent plate is likely to occur; however, in this case, it is possible to prevent the occurrence of a tack mark.

In the present invention, the transparent plate may be a display panel of a timepiece. This makes it possible to maintain a good visual appearance of the display panel.

Advantageous Effects of the Invention

As described above, according to the present invention, it is possible to prevent, in a solar cell covered with a transparent plate through a predetermined gap and an electronic device having the same, occurrence of the tack mark due to partial contact between the solar cell and the transparent plate.

MODE FOR CARRYING OUT THE INVENTION

Hereinafter, preferred embodiments of the present invention will be described in detail with reference to the accompanying drawings.

Figure 1:
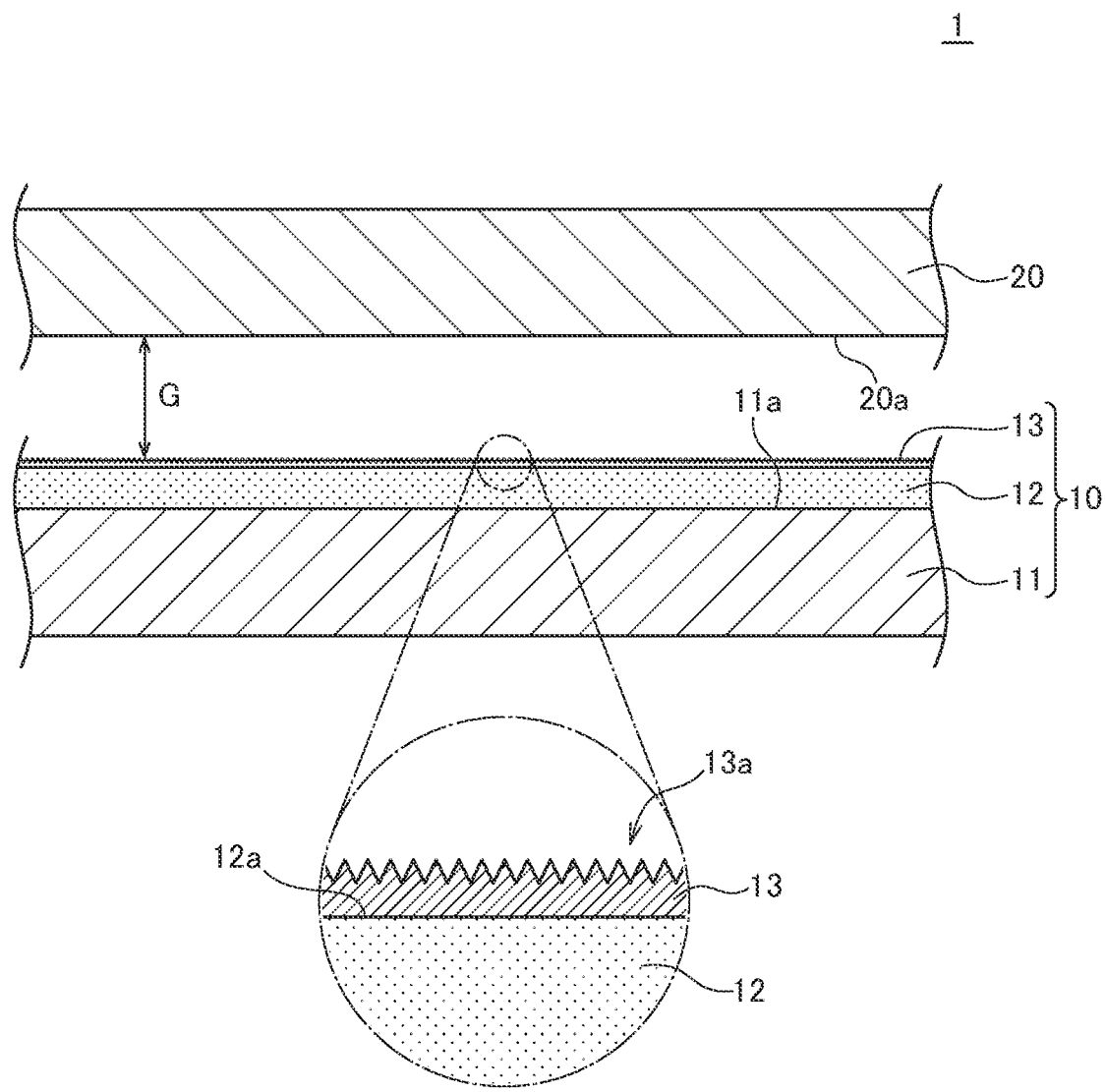
FIG. 1 is a schematic cross-sectional view illustrating the configuration of an electronic device 1 according to a first embodiment of the present invention.

FIG. 1 is a schematic cross-sectional view illustrating the configuration of an electronic device 1 according to a first embodiment of the present invention.

As illustrated in FIG. 1, the electronic device 1 according to the present embodiment includes a solar cell 10 and a transparent plate 20 covering the solar cell 10 through a gap G. Although there is no particular restriction on the type of the electronic device 1, the electronic device 1 may be, for example, a solar-powered timepiece. In particular, when the electronic device 1 is a solar-powered watch, it is required to be miniaturized, and therefore, the gap G is set to be equal to or smaller than 1 mm.

The solar cell 10 includes a flexible power generating layer 11 made of silicon or the like, a resin layer 12 covering a light receiving surface 11a of the power generating layer 11, and an adhesion preventing layer 13 covering a surface 12a of the resin layer 12. The total thickness of the solar cell 10 is equal to or less than 500 μm, preferably, equal to or less than 300 μm. The power generating layer 11 is a semiconductor device which photoelectrically converts light incident thereon through the transparent plate 20 and uses a film-like substrate made of resin such as polyimide, PET, or PEN. Thus, it is possible to process the power generating layer 11 into a complicated shape and to inexpensively and easily perform processing such as drilling. Power generated by the power generating layer 11 is supplied to a movement or electronic circuit (not illustrated). The resin layer 12 is, for example, a passivation film which protects the power generating layer 11 and has a thickness of 100 μm or less, preferably 30 μm or less. The resin layer 12 can be formed by printing a thermosetting resin. With this configuration, it is possible to form the resin layer 12 at a lower cost than when forming the resin layer 12 by sticking the film and to reduce the overall thickness. The thickness of the resin layer 12 is preferably 5 μm or more. This is because when the thickness of the resin layer 12 is less than 5 μm, a sufficient protective effect cannot be produced due to, for example, a reduction in moisture resistance, and this results in a reduction in reliability.

When the electronic device 1 according to the present embodiment is a solar-powered timepiece, the transparent plate 20 is a dial, a decorative plate, a liquid crystal panel, or the like and serves to display a current time and the like. As described above, the transparent plate 20 may not necessarily be completely transparent and only needs to have light transmittance high enough to allow light passing therethrough to reach the power generating layer 11. The transparent plate 20 may be flexible or rigid.

The adhesion preventing layer 13 is made of an inorganic material such as silica, and its surface 13a faces a surface 20a of the transparent plate 20 through the gap G. The adhesion preventing layer 13 serves to prevent the occurrence of the tack mark caused by the contact of the flexible solar cell 10 with the transparent plate 20 and adhesion thereof to the transparent plate 20. To achieve this, the surface 13a of the adhesion preventing layer 13 has a nano-level fine unevenness. Specifically, the surface 13a of the adhesion preventing layer 13 has a surface roughness Sz defined in ISO 25178 of 1 nm or more and 500 nm or less. As a result, even when the solar cell 10 contacts the surface 20a of the transparent plate 20, no tack mark is caused due to the effect of the adhesion preventing layer 13.

In order to prevent the occurrence of the tack mark more effectively, the adhesion preventing layer 13 preferably has a surface hardness (Vickers hardness) of 2H or more and a thickness of 10 nm or more and 1000 nm or less. Further, the adhesion preventing layer 13 preferably has a light transmittance of 70% or more so as to sufficiently ensure the amount of incident light to the power generating layer 11.

Although a method of forming the adhesion preventing layer 13 is not particularly limited, there may be employed a method of fixing the adhesion preventing layer 13 to the surface 12a of the resin layer 12 by forming silica on the surface 12a of the resin layer 12 by a sol-gel method, followed by heating treatment at about 160°. Alternatively, a solvent containing fine silica powder may be applied to the surface 12a of the resin layer 12, followed by heating treatment at about 160°, whereby the adhesion preventing layer 13 may be fixed on the surface 12a of the resin layer 12.

As a method for preventing adhesion of the solar cell 10 and the transparent plate 20, a method of adding an anti-blocking agent to the resin layer 12 may be considered. However, in this method, the resin layer 12 becomes white, and the amount of incident light to the power generating layer 11 is significantly reduced. On the other hand, in this embodiment, the anti-blocking agent is not added to the resin layer 12, but the adhesion preventing layer 13 having a nano-level fine unevenness on the surface 12a of the resin layer 12 is provided, so that it is possible to suppress a reduction in power generation amount. Rather, since the outermost surface of the solar cell 10 has a moth-eye structure, reflected light on the outermost surface of the solar cell 10 is reduced, and the amount of incident light to the power generating layer 11 can be increased. Specifically, when the light transmittance of the resin layer 12 before forming the adhesion preventing layer 13 is about 93%, the light transmittance is improved to about 96% by providing the adhesion preventing layer 13 on the surface 12a of the resin layer 12.

As described above, according to the present embodiment, in the electronic device 1 having a structure in which the flexible solar cell 10 and the transparent plate 20 face each other through the gap G, it is possible to prevent the occurrence of the tack mark even when the solar cell 10 and the transparent plate 20 partially come into contact with each other while suppressing a reduction in the power generation amount.

Figure 2:
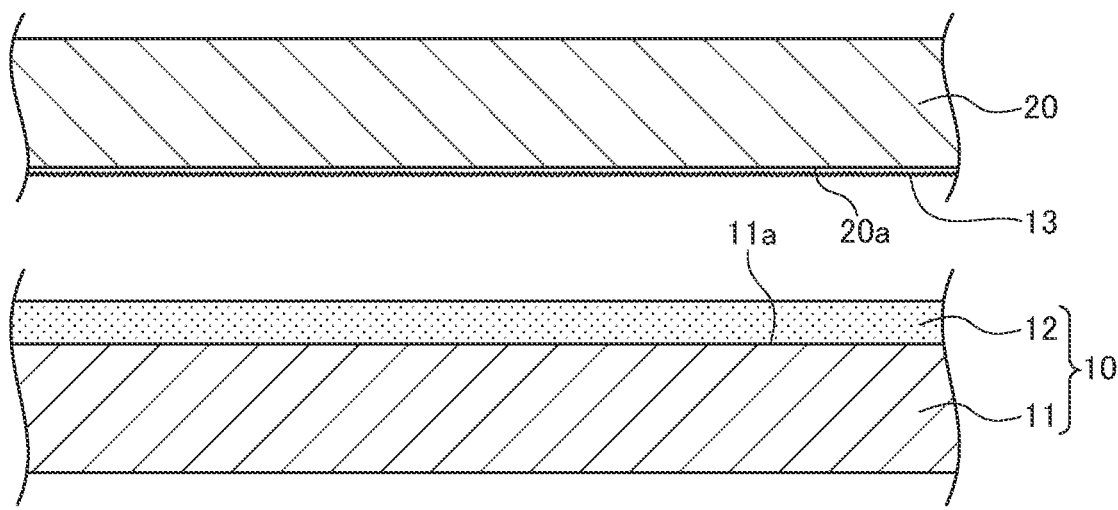
FIG. 2 is a schematic cross-sectional view for explaining the configuration of an electronic device 2 according to a second embodiment of the present invention.

FIG. 2 is a schematic cross-sectional view for explaining the configuration of an electronic device 2 according to a second embodiment of the present invention.

The electronic device 2 illustrated in FIG. 2 differs from the electronic device 1 according to the first embodiment in that the adhesion preventing layer 13 is provided on the surface 20a of the transparent plate 20. Other configurations are the same as those of the electronic device 1 according to the first embodiment, so the same reference numerals are given to the same elements, and overlapping description will be omitted.

As exemplified by the present embodiment, it is not essential to provide the adhesion preventing layer 13 on the solar cell 10 side in the present invention, and the adhesion preventing layer 13 may be provided on the transparent plate 20 side.

Figure 3:
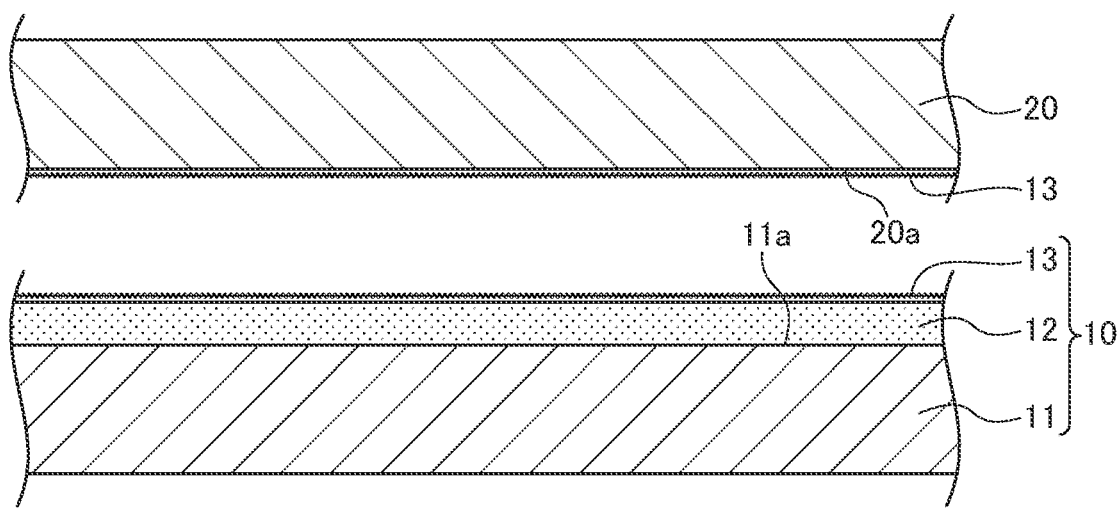
FIG. 3 is a schematic cross-sectional view for explaining the configuration of an electronic device 3 according to a third embodiment of the present invention.

FIG. 3 is a schematic cross-sectional view for explaining the configuration of an electronic device 3 according to a third embodiment of the present invention.

The electronic device 3 illustrated in FIG. 3 differs from the electronic device 1 according to the first embodiment in that the adhesion preventing layer 13 is provided on both the surface 12*a* of the resin layer 12 and the surface 20*a* of the transparent plate 20. Other configurations are basically the same as those of the electronic device 1 according to the first embodiment, so the same reference numerals are given to the same elements, and overlapping description will be omitted.

As exemplified by the present embodiment, the adhesion preventing layer 13 may be provided on both the solar cell 10 and the transparent plate 20 in the present invention.

While the preferred embodiment of the present invention has been described, the present invention is not limited to the above embodiment, and various modifications may be made within the scope of the present invention, and all such modifications are included in the present invention.

REFERENCE SIGNS LIST 1-3 electronic device
10 solar cell
11 power generating layer
11*a* light receiving surface
12 resin layer
12*a* surface of resin layer
13 adhesion preventing layer
13*a* surface of adhesion preventing layer
20 transparent plate
20*a* surface of transparent plate
G gap

What is claimed is:

1. A solar cell covered with a transparent plate through a predetermined gap, the solar cell comprising:
   a flexible power generating layer which photoelectrically converts light incident thereon through the transparent plate;
   a resin layer covering a light receiving surface of the power generating layer; and
   an adhesion preventing layer covering a surface of the resin layer and facing the transparent plate through a gap,
   wherein the adhesion preventing layer is made of an inorganic material and has a surface roughness Sz of 1 nm or more and 500 nm or less.

2. The solar cell as claimed in claim 1, wherein the adhesion preventing layer has a surface hardness of 2H or more and a thickness of 10 nm or more and 1000 nm or less.

3. The solar cell as claimed in claim 1, wherein the adhesion preventing layer has a light transmittance of 70% or more.

4. An electronic device comprising:
   a solar cell; and
   a transparent plate covering a solar cell through a predetermined gap,
   wherein the solar cell includes a flexible power generating layer which photoelectrically converts light incident thereon through a transparent plate and a resin layer covering a light receiving surface of the power generating layer, and
   wherein at least one of a surface of the resin layer facing the transparent plate through the gap and a surface of the transparent plate facing the resin layer through the gap is covered with an adhesion preventing layer made of an inorganic material and having a surface roughness Sz of 1 nm or more and 500 nm or less.

5. The electronic device as claimed in claim 4, wherein the gap is 1 mm or less.

6. The electronic device as claimed in claim 4, wherein the transparent plate is a display panel of a timepiece.

7. The solar cell as claimed in claim 2, wherein the adhesion preventing layer has a light transmittance of 70% or more.

8. The electronic device as claimed in claim 5, wherein the transparent plate is a display panel of a timepiece.

* * * * *